United States Patent
Drennan et al.

(10) Patent No.: US 12,153,087 B2
(45) Date of Patent: Nov. 26, 2024

(54) APPARATUS AND METHOD FOR TESTING ALL TEST CIRCUITS ON A WAFER FROM A SINGLE TEST SITE

(71) Applicant: IC ANALYTICA, LLC, Austin, TX (US)

(72) Inventors: Patrick G. Drennan, Gilbert, AZ (US); Joseph S. Spector, Austin, TX (US); Richard Wunderlich, Austin, TX (US)

(73) Assignee: IC ANALYTICA, LLC, Austin, TX (US)

( * ) Notice: Subject to any disclaimer, the term of this patent is extended or adjusted under 35 U.S.C. 154(b) by 0 days.

(21) Appl. No.: 17/849,008

(22) Filed: Jun. 24, 2022

(65) Prior Publication Data

US 2022/0413040 A1    Dec. 29, 2022

Related U.S. Application Data

(60) Provisional application No. 63/215,074, filed on Jun. 25, 2021.

(51) Int. Cl.
| | | |
|---|---|---|
| G01R 31/28 | (2006.01) | |
| G01R 1/02 | (2006.01) | |
| G01R 1/04 | (2006.01) | |
| G01R 1/067 | (2006.01) | |
| G01R 1/073 | (2006.01) | |
| G01R 31/26 | (2020.01) | |

(52) U.S. Cl.
CPC ..... *G01R 31/2887* (2013.01); *G01R 1/07342* (2013.01)

(58) Field of Classification Search
CPC . G01R 1/02; G01R 1/04; G01R 1/067; G01R 1/073; G01R 31/02; G01R 31/26; G01R 31/28; G01R 31/31; G01R 31/3185; G01R 31/317
See application file for complete search history.

(56) References Cited

U.S. PATENT DOCUMENTS

| | | | |
|---|---|---|---|
| 2002/0047724 A1 | 4/2002 | Marshall et al. | |
| 2007/0102701 A1* | 5/2007 | Pourkeramati | .... G01R 31/2884 257/48 |
| 2007/0244593 A1 | 10/2007 | Kinoshita | |
| 2010/0237891 A1* | 9/2010 | Lin | .... G01R 31/2851 324/750.3 |
| 2016/0070277 A1 | 3/2016 | Price et al. | |

(Continued)

FOREIGN PATENT DOCUMENTS

WO    WO-2022272034 A1    12/2022

OTHER PUBLICATIONS

International Search Report and Written Opinion for Application No. PCT/US2022/034857, mailed on Sep. 21, 2022, 16 pages.

(Continued)

*Primary Examiner* — Neel D Shah
(74) *Attorney, Agent, or Firm* — Cooley LLP

(57) ABSTRACT

An apparatus has a semiconductor wafer hosting rows and columns of chips, where the rows and columns of chips are separated by scribe lines. Vertical and horizontal routing lines are in the scribe lines interconnecting the rows and columns of chips. Test circuit sites are in the scribe lines, each test circuit site including contact pads for simultaneous connection to probe card needles, sensor circuit select and control circuitry, and a sensor circuit bank.

15 Claims, 7 Drawing Sheets

(56) References Cited

U.S. PATENT DOCUMENTS

2019/0157243 A1\* 5/2019 Fricker ............... H01L 25/0655
2020/0132757 A1 4/2020 Huang et al.

OTHER PUBLICATIONS

International Preliminary Report on Patentability for International Application No. PCT/US2022/034857 dated Jan. 4, 2024, 6 pages.

\* cited by examiner

US 12,153,087 B2

APPARATUS AND METHOD FOR TESTING ALL TEST CIRCUITS ON A WAFER FROM A SINGLE TEST SITE

CROSS-REFERENCE TO RELATED INVENTION

This application claims priority to U.S. Provisional Patent Application Ser. No. 63/215,074, filed Jun. 25, 2021, the contents of which are incorporated herein by reference.

FIELD OF THE INVENTION

This invention relates generally to testing semiconductor wafers. More particularly, this invention relates to techniques for testing all test circuits on a wafer from a single test site.

BACKGROUND OF THE INVENTION

FIG. 1 illustrates a known semiconductor wafer testing system including test equipment 100 connected to a probe card 102, which makes connections with pads on a wafer 104. FIG. 2 illustrates a semiconductor wafer 104 with individual chips 200. The individual chips 200 form rows and columns of chips which are separated by scribe lines 202. Within scribe line 202 there are test circuits 204. The test circuits 204 are used during wafer level testing. When testing is completed, a saw is used in the scribe lines to divide the individual chips for subsequent packaging. This cutting process destroys the test circuits 204 in the scribe lines. FIG. 3 illustrates a simple test circuit with a gate pad 300, a source pad 302 and a drain pad 304. A probe card needle 306 is connected to the drain pad 304. FIG. 4 illustrates multiple probe card needles 306 connected to multiple pads 400 of a semiconductor. Placement of probe card needles on different sites on a wafer is time consuming.

Thus, there is a need for improved wafer testing techniques.

SUMMARY OF THE INVENTION

An apparatus has a semiconductor wafer hosting rows and columns of chips, where the rows and columns of chips are separated by scribe lines. Vertical and horizontal routing lines are in the scribe lines interconnecting the rows and columns of chips. Test circuit sites are in the scribe lines, each test circuit site including contact pads for simultaneous connection to probe card needles, sensor circuit select and control circuitry, and a sensor circuit bank.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
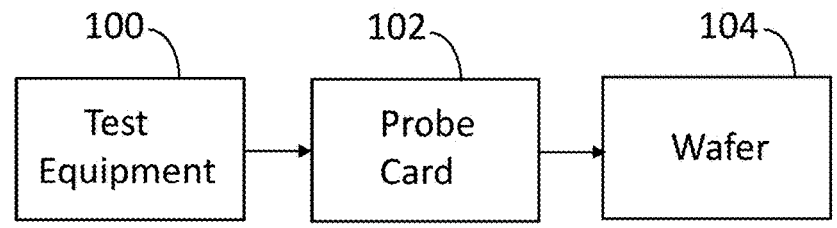
FIG. 1 illustrates a semiconductor wafer testing system known in the prior art.
Figure 2:
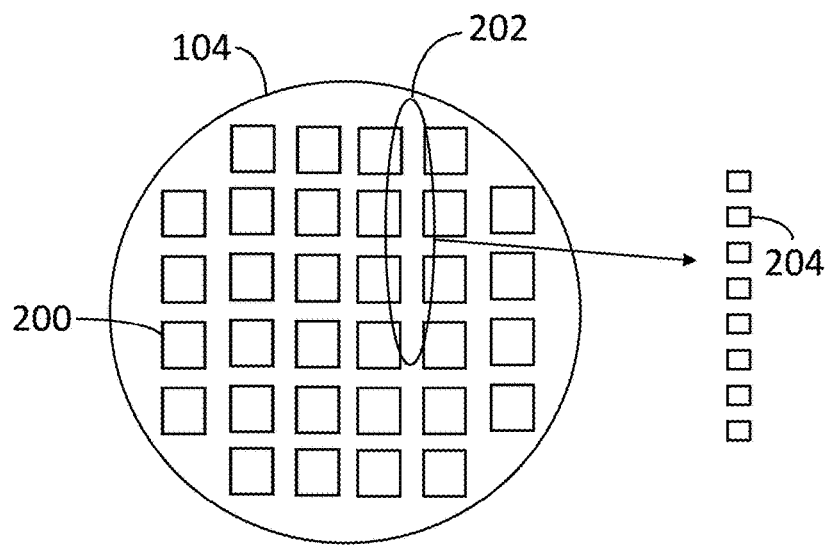
FIG. 2 illustrates a prior art semiconductor wafer with a scribe line hosting test circuits.
Figure 3:
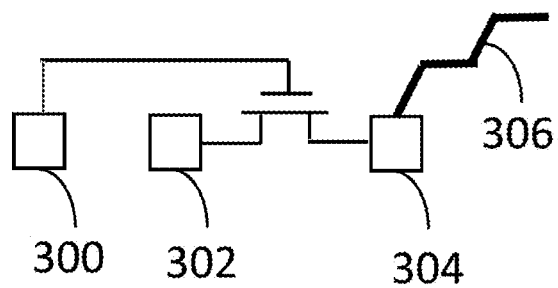
FIG. 3 illustrates a prior art test circuit and associated probe card needle.
Figure 4:
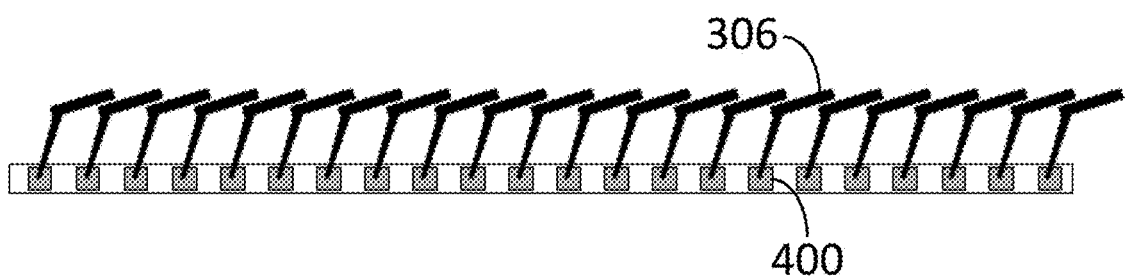
FIG. 4 illustrates prior art probe card needles connected to test circuit pads.
Figure 5:
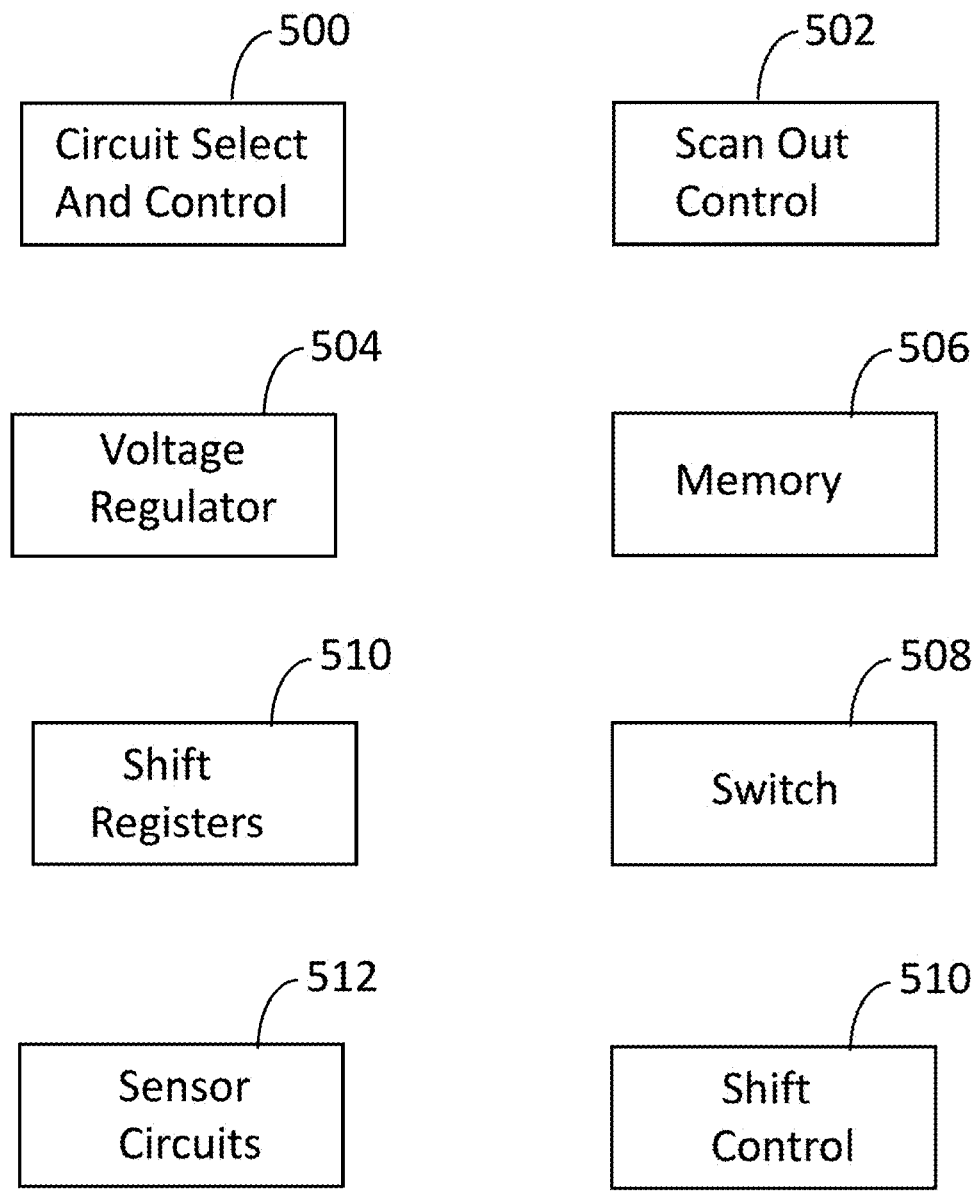
FIG. 5 illustrates components associated with embodiments of the invention.

FIG. 5 illustrates components of the invention formed in scribe lines of a wafer. The components include circuit select and control circuitry 500, scan out control circuitry 502, one or more voltage regulators 504, one or more memory banks 506, one or more switches 508, one or more shift registers 510, shift control circuitry 510 and sensor circuits 512.

Figure 6:
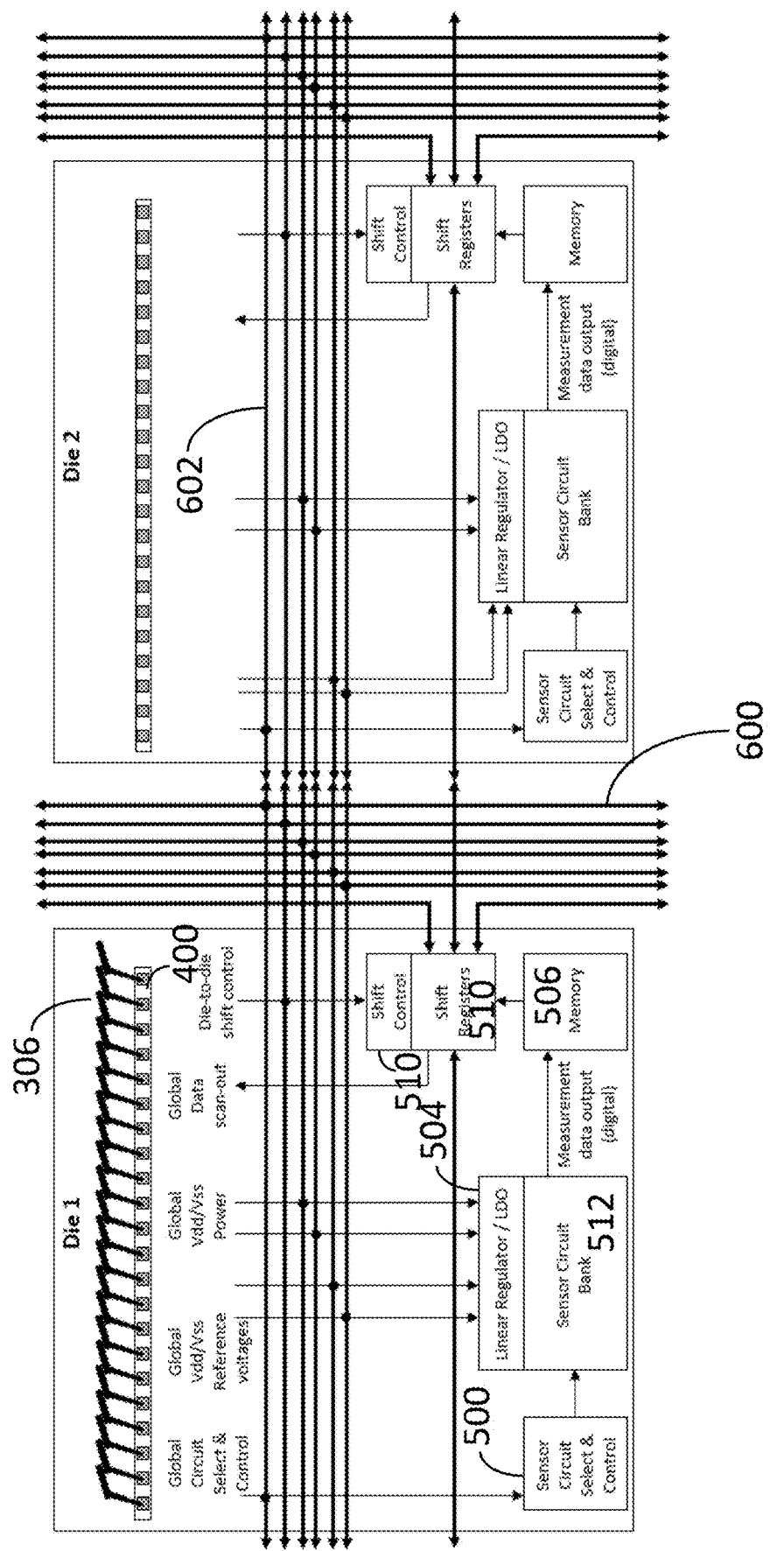
FIG. 6 illustrates probe card needles engaging test circuit pads on a single test site that is used to access different test sites on a wafer, with each test site including a voltage regulator.

FIG. 6 illustrates vertical routing lines 600 and horizontal routing lines 602 used to interconnect all test sites on different die of a wafer. In this way, all of the test sites on all of the die can be accessed from the probe contacts from any single die. By way of example, Die 1 has a test site with pads 400 to engage probe card needles 306. Die 1 has a circuit select and control circuit 500 responsive to a global circuit select and control signal from test equipment 100. A voltage or linear regulator 504 receives a global Vdd/Vss power signal and a global Vdd/Vss reference voltage, which is used to regulate the global Vdd/Vss power signal to accommodate process variations and inconsistent resistive networks. Power is supplied via Vdd and Vss power pads and is distributed to all die on the wafer. Since there is current flowing through the power distribution network, the resistance on each path produces an "IR" voltage drop wherein the Vdd and Vss voltages that are measured at the sensor circuit are different from the Vdd and Vss voltages that are applied at the test equipment 100. The magnitude of the IR voltage drop varies significantly for each die since each die has a different amount of resistance in the power distribution path. In one implementation, a separate reference voltage for Vdd and/or Vss is routed to each die through a network that is fully separate and independent from the power distribution path. In the case of the reference voltage network, the terminal resistances at the equipment side and on each die is very high so that only a negligible amount of current is flowing through the reference path and there is negligible IR voltage drop. In or near the sensor circuit bank 604, voltage regulator 504 is used to adjust the Vdd and/or Vss of the sensor circuit bank so that the reference voltages are achieved directly at the sensor circuit bank 604. The linear regulator 504 has an additional feature wherein it isolates and suppresses any switching noise or voltage changes from the test circuits that might be injected back on the global power distribution network. This is a key feature when running multiple test circuits at the same time (on different sensor circuit banks) in that the switching noise from one test circuit does not interfere and corrupt the measurement on other test circuits that are running at the same time.

The sensor circuit bank 512 is a circuit block that contains an array of test circuits, such as ring oscillators, that may contain a number anywhere from a few test circuits to perhaps tens of thousands of test circuits. A pad or pads on the pad array module are allocated for driving the sensor circuit select and control 500, which is used to select and run a single circuit in the sensor circuit bank 512 for a period of time. In one implementation, the same test circuit at the same digital address in the sensor circuit bank 512 is run on all die simultaneously. The measurement results, which are digitized values from each sensor circuit in the sensor circuit bank 512, are output to a memory 506. The memory 506 can be built to store the results from the entire set of sensor circuits in the sensor circuit bank 512 or for just one sensor circuit.

The measurement data stored in memory can be output to the probe pad module via a network of shift registers located on each die. Data is first copied from the memory 506 to the shift registers 510. Using the shift control 510, which is controlled from a pad or pads on the probe pad module, the network of shift registers are directed to move the data between die in any of four directions (up, down, left, right). All die on the wafer receive the same shift command. If the data stored in registers on die on the edge of the wafer are shifted to a location that is off of the die edge, the data is deleted. The original set of measurements can be restored by pushing the measurement data from the memory bank to the shift registers again. In this manner, all measurement data can be scanned out through a pad or pads on the pad array module.

A sensor circuit bank 512 executes wafer testing operations with measurement results being loaded into memory 506. The measurement results are read from memory to shift registers 510 operative with shift control circuit 510. The shift control circuit 510 receives a die-to-die sift control signal, which results in the shift registers supplying a global data scan-out signal that is routed to the test equipment.

Figure 7:
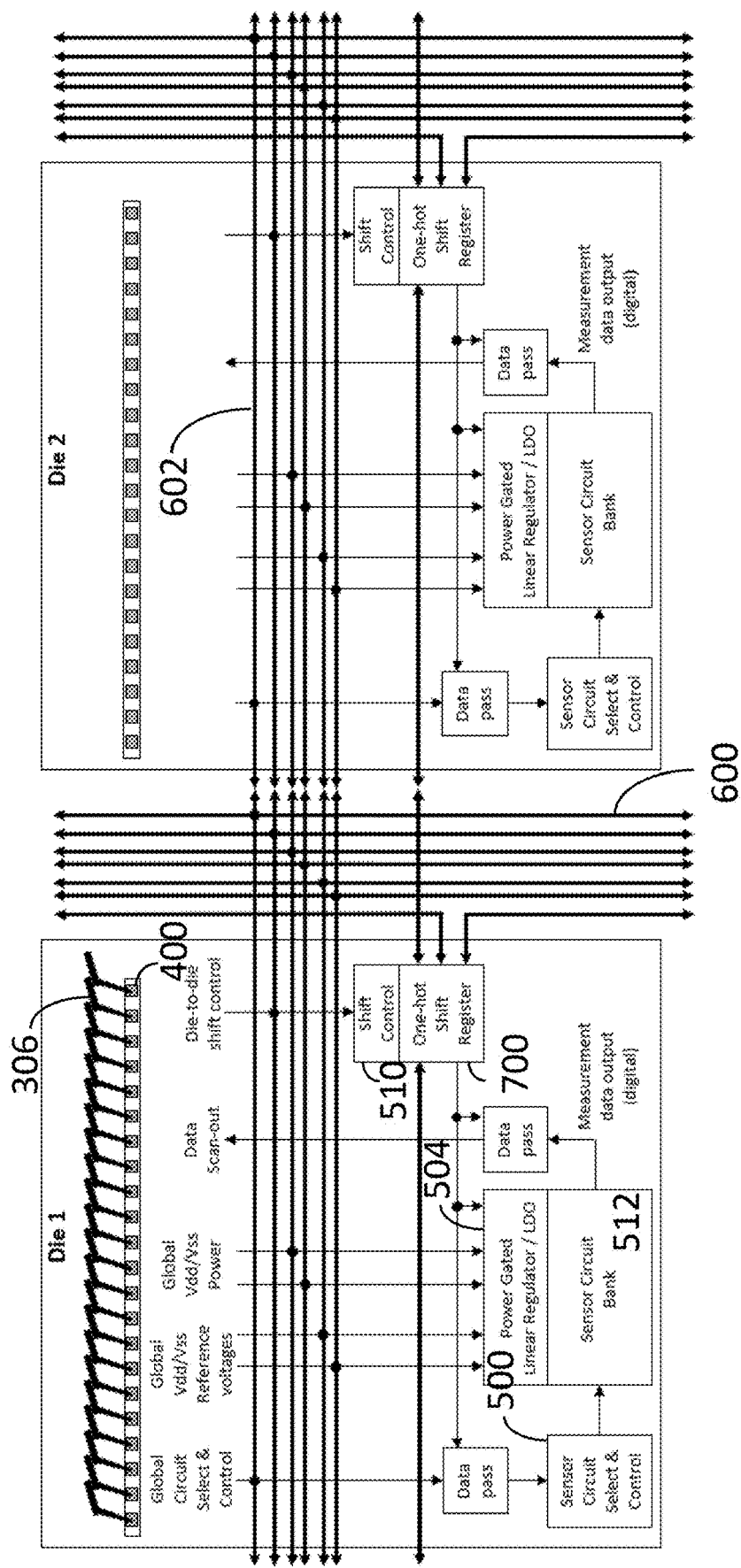
FIG. 7 illustrates probe card needles engaging test circuit pads on a single test site that is used to access different test sites on a wafer, with each test site including power gated linear regulator.

FIG. 7 illustrates an embodiment where only one die or test site is measured at a time. Data shift control uses to shift a "One-Hot" selection scheme (i.e., only 1 die or test site contains data in the shift registers across the die in the horizontal and vertical directions). The One-Hot bit selection connects or disconnects the sensor circuit select and control circuit 500 from the global circuit select and control.

Figure 8:
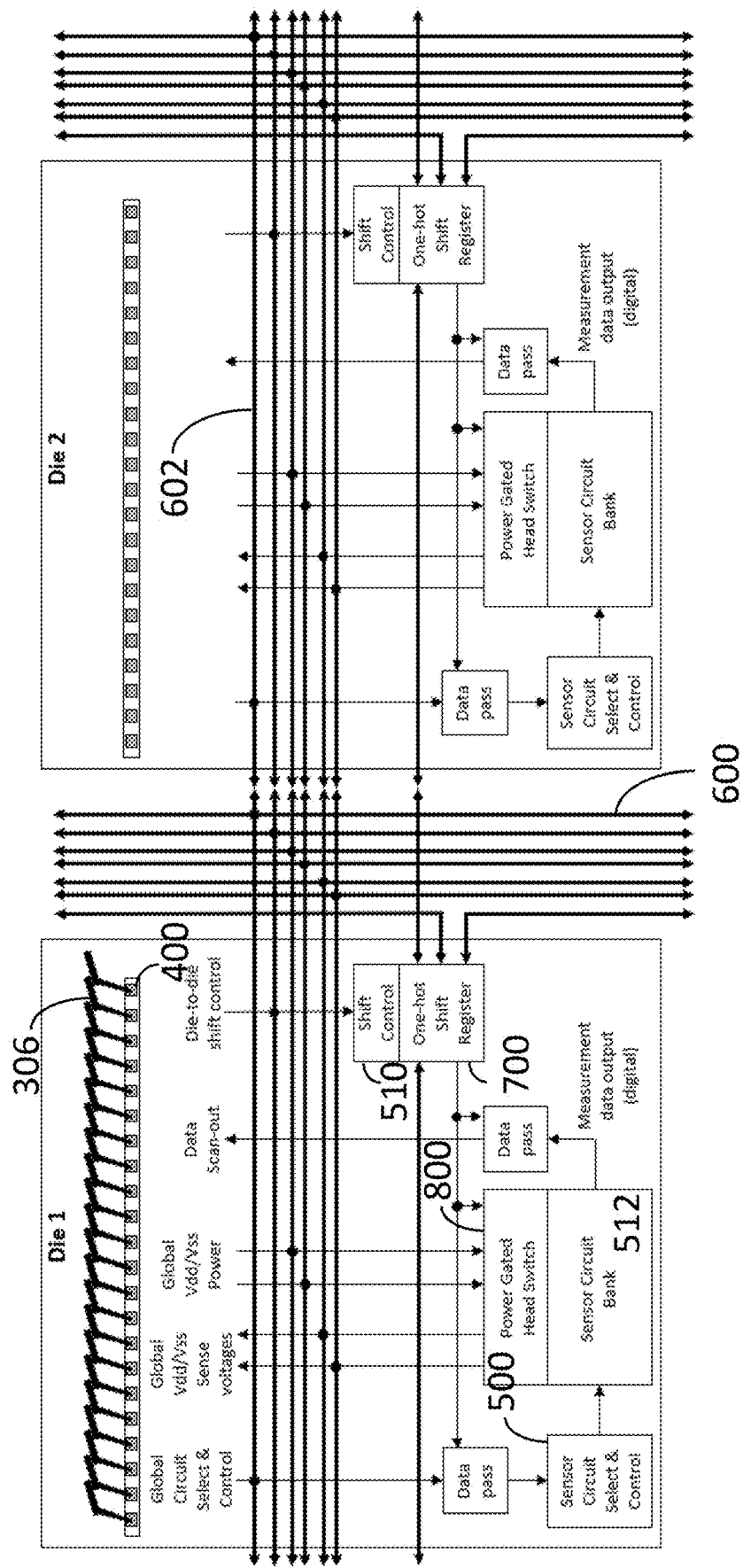
FIG. 8 illustrates probe card needles engaging test circuit pads on a single test site that is used to access different test sites on a wafer, with each test site including a power gated header switch.

FIG. 8 is another embodiment where the regulator 504 is replaced with a power gated head switch and the Vdd/Vss reference voltages are replaced with Vdd/Vss voltage sense signals. This circuit senses the voltages at Vdd and Vss and reads out the values to the external test equipment 100. In this scheme, each test circuit in the sensor circuit bank 512 on each die or test site must be run sequentially. The power gated head switch connects the Vdd and Vss rails of the one-hot selected die or test site to the global Vdd/Vss sense connection. Now the external test equipment can measure and record the Vdd and Vss voltages at the Vdd and Vss rails of the sensor circuit bank 512. As an optional implementation, the global Vdd/Vss sense voltage measurement can be used to correct the global Vdd/Vss power values (i.e., correct for the IR voltage drop between the global Vdd/Vss power pads and the sensor circuit bank so that the intended supply voltages are applied to the sensor circuit bank 512).

It should be appreciated that the vertical routing lines 600, the horizontal routing lines 602 and the various test circuits in the scribe lines may be implemented on multiple metal layers connected by vias.

Figure 9:
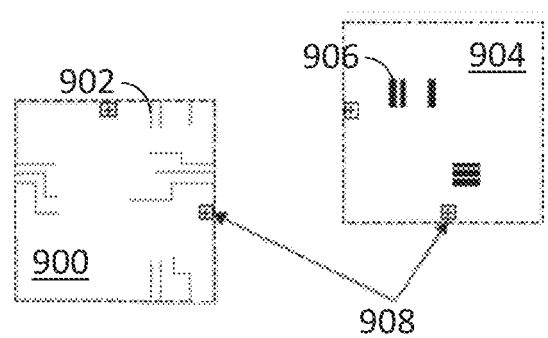
FIG. 9 illustrates an existing metal mask and stitching metal mask utilized in accordance with an embodiment of the invention.

FIG. 9 illustrates an existing metal mask 900 used to form a metal layer associated with a die 200. The metal mask 900 includes metal traces 902 that extend to the end of a die. An embodiment of the invention uses a stitching metal mask 904 to extend the metal traces 902 of a die into scribe lines for connections to other components. The stitching metal mask 904 includes metal extensions 906. Mask alignment marks 908 exist on both the existing metal mask 900 and the stitching metal mask 904.

Figure 10:
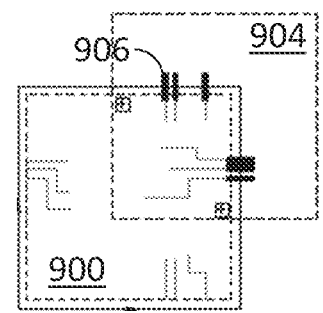
FIG. 10 illustrates the stitching metal mask aligned with the existing metal mask in accordance with an embodiment of the invention.
Figure 11:
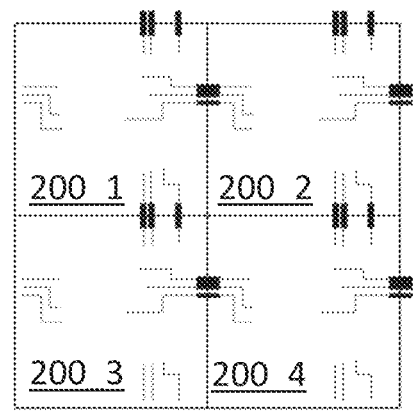
FIG. 11 illustrates four adjacent die linked by metal extensions from the stitching metal mask.

FIG. 10 illustrates the existing metal mask 900 aligned with the stitching metal mask 904. This allows for four adjacent die 200_1, 200_2, 200_3 and 200_4 to be interconnected on a metal layer, as shown in FIG. 11.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
    a semiconductor wafer hosting rows and columns of chips, where the rows and columns of chips are separated by scribe lines;
    vertical and horizontal routing lines in the scribe lines; and
    test circuits in the scribe lines, each test circuit including
        a plurality of contact pads for simultaneous connection to probe card needles, sensor circuit select and control circuitry, and
        a sensor circuit bank;
    wherein the vertical and horizontal routing lines interconnect all test circuits facilitating testing all test circuits from a single test circuit.

2. The apparatus of claim 1 wherein each test circuit further includes a memory storing measurement results, the measurement results are read from memory to shift registers operative with a shift control circuit that results in the shift registers supplying a global data scan-out signal that is routed to test equipment.

3. The apparatus of claim 1 wherein each test circuit further includes shift control circuitry.

4. The apparatus of claim 1 wherein each test circuit further includes a header switch.

5. The apparatus of claim 1 wherein the contact pads include contact pads for Vdd and Vss global power signals.

6. The apparatus of claim 1 wherein the contact pads include contact pads for Vdd and Vss reference signals.

7. The apparatus of claim 1 wherein the contact pads include contact pads for Vdd and Vss sense signals.

8. The apparatus of claim 1 wherein the contact pads include a contact pad for global sensor circuit control signals.

9. The apparatus of claim 1 wherein the contact pads include a contact pad for scan out control signals.

10. The apparatus of claim 1 wherein the contact pads include a contact pad for measurement scan out signals.

11. The apparatus of claim 1 wherein the rows and columns of chips are selectively connected in the scribe lines by metal extensions from a stitching metal mask.

12. The apparatus of claim 11 wherein the stitching metal mask has mask alignment marks.

13. An apparatus, comprising:
a semiconductor wafer hosting rows and columns of chips, where the rows and columns of chips are separated by scribe lines;
vertical and horizontal routing lines in the scribe lines; and
test circuits in the scribe lines, each test circuit site including
a plurality of contact pads for simultaneous connection to probe card needles, sensor circuit select and control circuitry, and
a sensor circuit bank;
wherein the vertical and horizontal routing lines interconnect all test circuits facilitating testing all test circuits from a single test site; and
wherein each test circuit further includes a voltage regulator to adjust voltage of the sensor circuit bank so that a reference voltage is achieved directly at the sensor circuit bank.

14. An apparatus, comprising:
a semiconductor wafer hosting rows and columns of chips, where the rows and columns of chips are separated by scribe lines;
vertical and horizontal routing lines in the scribe lines; and
test circuits in the scribe lines, each test circuit site including
a plurality of contact pads for simultaneous connection to probe card needles, sensor circuit select and control circuitry, and
a sensor circuit bank;
wherein the vertical and horizontal routing lines interconnect all test circuits facilitating testing all test circuits from a single test site; and
wherein each test circuit further includes shift registers forming a network of shift registers to move data in four directions on the semiconductor wafer.

15. An apparatus, comprising:
a semiconductor wafer hosting rows and columns of chips, where the rows and columns of chips are separated by scribe lines;
vertical and horizontal routing lines in the scribe lines; and
test circuits in the scribe lines, each test circuit site including
a plurality of contact pads for simultaneous connection to probe card needles, sensor circuit select and control circuitry, and
a sensor circuit bank;
wherein the vertical and horizontal routing lines interconnect all test circuits facilitating testing all test circuits from a single test site; and
wherein each test circuit further includes a one-hot shift register to connect or disconnect the sensor circuit select and control circuitry from global circuit select and control.

* * * * *